United States Patent
Arceo de la Pena et al.

(10) Patent No.: US 11,543,751 B2
(45) Date of Patent: Jan. 3, 2023

(54) ORGANIC PHOTORESIST ADHESION TO METAL OXIDE HARDMASKS

(71) Applicant: International Business Machines Corporation, Armonk, NY (US)

(72) Inventors: Abraham Arceo de la Pena, Albany, NY (US); Jennifer Church, Troy, NY (US); Nelson Felix, Slingerlands, NY (US); Ekmini Anuja De Silva, Slingerlands, NY (US)

(73) Assignee: International Business Machines Corporation, Armonk, NY (US)

(*) Notice: Subject to any disclaimer, the term of this patent is extended or adjusted under 35 U.S.C. 154(b) by 428 days.

(21) Appl. No.: 16/851,034

(22) Filed: Apr. 16, 2020

(65) Prior Publication Data

US 2021/0325784 A1    Oct. 21, 2021

(51) Int. Cl.
G03F 7/09    (2006.01)
G03F 7/20    (2006.01)
H01L 21/027    (2006.01)
H01L 21/04    (2006.01)
H01L 21/033    (2006.01)
H01L 21/02    (2006.01)

(52) U.S. Cl.
CPC ............ G03F 7/094 (2013.01); G03F 7/2037 (2013.01); H01L 21/022 (2013.01); H01L 21/0274 (2013.01); H01L 21/0332 (2013.01); H01L 21/0337 (2013.01); H01L 21/046 (2013.01)

(58) Field of Classification Search
CPC .................................................. H01L 21/0337
See application file for complete search history.

(56) References Cited

U.S. PATENT DOCUMENTS

| 8,124,485 | B1 | 2/2012 | Goldfarb et al. |
| 8,415,212 | B2 | 4/2013 | Schaeffer et al. |
| 9,075,309 | B2 | 7/2015 | Ogihara et al. |
| 2003/0082924 | A1* | 5/2003 | Andideh ........... H01L 21/76801 257/E21.252 |
| 2012/0009802 | A1* | 1/2012 | LaVoie .............. C23C 16/45529 118/704 |
| 2013/0126984 | A1 | 5/2013 | Reimer et al. |
| 2014/0234468 | A1 | 8/2014 | Taniguchi et al. |
| 2019/0157072 | A1 | 5/2019 | De La Pena et al. |
| 2019/0187565 | A1* | 6/2019 | Xu ......................... G03F 7/0752 |

FOREIGN PATENT DOCUMENTS

| CN | 102097380 A | 6/2011 |
| JP | 2017194588 A | * 10/2017 |

OTHER PUBLICATIONS

Joe Daggett, et al. "HMDS Process: Cleanroom Research Laboratory," University of Texas at Dallas, Feb. 2003, pp. 1-15, https://research.utdallas.edu/cleanroom/manuals/hmds-process.

* cited by examiner

Primary Examiner — Duane Smith
Assistant Examiner — Nicholas E Brown
(74) Attorney, Agent, or Firm — Abdy Raissinia; Otterstedt & Kammer PLLC

(57) ABSTRACT

An exemplary semiconductor fabrication stack includes underlying layers; an organic planarization layer atop the underlying layers; a metal oxide hardmask atop the organic planarization layer and doped with both carbon and nitrogen; and an organic photoresist directly atop the doped metal oxide hardmask. In one or more embodiments, the doped metal oxide hardmask exhibits a water contact angle of greater than 80°.

20 Claims, 7 Drawing Sheets

ORGANIC PHOTORESIST ADHESION TO METAL OXIDE HARDMASKS

BACKGROUND

The present invention relates to the electrical, electronic, and computer arts, and more specifically, to manufacturing semiconductor devices.

Semiconductor device manufacturing is an expensive multistep process that requires a significant amount of equipment, electricity, and chemicals. Typically, a workpiece will be moved among several pieces of equipment, performing one step in a first process chamber, another step in a second process chamber, and another step back in the first process chamber or in a third process chamber. Each time the workpiece is moved, there is an opportunity for error that will lead to manufacturing defects and scrappage. Each operation of a process chamber requires electrical power and consumable chemicals. Generally, it is desirable to reduce workpiece moves and process chamber operations involved in manufacturing a semiconductor device.

SUMMARY

Principles of the invention provide techniques for improving organic photoresist adhesion to metal oxide hardmasks. In one aspect, an exemplary method includes depositing a planarization layer onto a semiconductor fabrication stack; depositing a metal oxide hardmask onto the planarization layer; doping the metal oxide hardmask with both carbon and nitrogen; and depositing an organic photoresist directly onto the doped metal oxide hardmask. In one or more embodiments, due to the doping with carbon and nitrogen, the doped metal oxide hardmask exhibits a water contact angle of greater than 80°.

In another aspect, an exemplary semiconductor fabrication stack includes underlying layers; an organic planarization layer atop the underlying layers; a metal oxide hardmask atop the organic planarization layer and including both carbon and nitrogen; and an organic photoresist directly atop the metal oxide hardmask. In one or more embodiments, the metal oxide hardmask exhibits a water contact angle of greater than 80°.

According to another aspect, an exemplary method includes depositing a planarization layer onto a semiconductor fabrication stack; depositing a metal oxide hardmask onto the planarization layer; doping the metal oxide hardmask with both carbon and nitrogen; checking whether a composition of the doped metal oxide hardmask meets a specification by performing X-ray photoelectron spectroscopy; and repeating the doping in response to the composition of the doped metal oxide hardmask not meeting the specification.

In view of the foregoing, techniques of the present invention can provide substantial beneficial technical effects. For example, one or more embodiments provide one or more of:

Ability to apply photoresist in fewer steps than current processes and without adhesion primer.

By having photoresist directly on top of the metal layer, ability to utilize a lower EUV dose and obtain higher reactivity. This is possible because metal hardmask absorbs more extreme ultraviolet (EUV) photons due to having a higher EUV absorbance cross-section, therefore generating more secondary electrons.

These and other features and advantages of the present invention will become apparent from the following detailed description of illustrative embodiments thereof, which is to be read in connection with the accompanying drawings.

DETAILED DESCRIPTION

Photolithography, including optical lithography, ultra-violet (UV) lithography, or extreme ultraviolet (EUV) lithography, is a process used in microfabrication to pattern parts of a thin film or the bulk of a substrate (also called a wafer). It uses light to transfer a geometric pattern from a photomask (also called an optical mask) to a photosensitive (that is, light-sensitive) chemical photoresist on the substrate. A series of chemical treatments then either etches the exposure pattern into the material or enables deposition of a new material in the desired pattern upon the material underneath the photoresist. In complex integrated circuits, a CMOS (complementary metal-oxide-semiconductor) wafer may go through the photolithographic cycle as many as fifty times.

In one or more embodiments, a "hardmask" is deposited below the photoresist. Although silicon based hardmasks are conventional, use of a metal oxide hardmask (e.g., metal oxides that incorporate "high-Z" metals with large numbers of protons such as $SnO_x$, $TiO_x$, $RuO_x$, $TaO_x$) can provide relatively high etch selectivity to resists, and an ability to use different types of etch chemistries compared to silicon based hardmasks.

Figures 1, 2, 3:
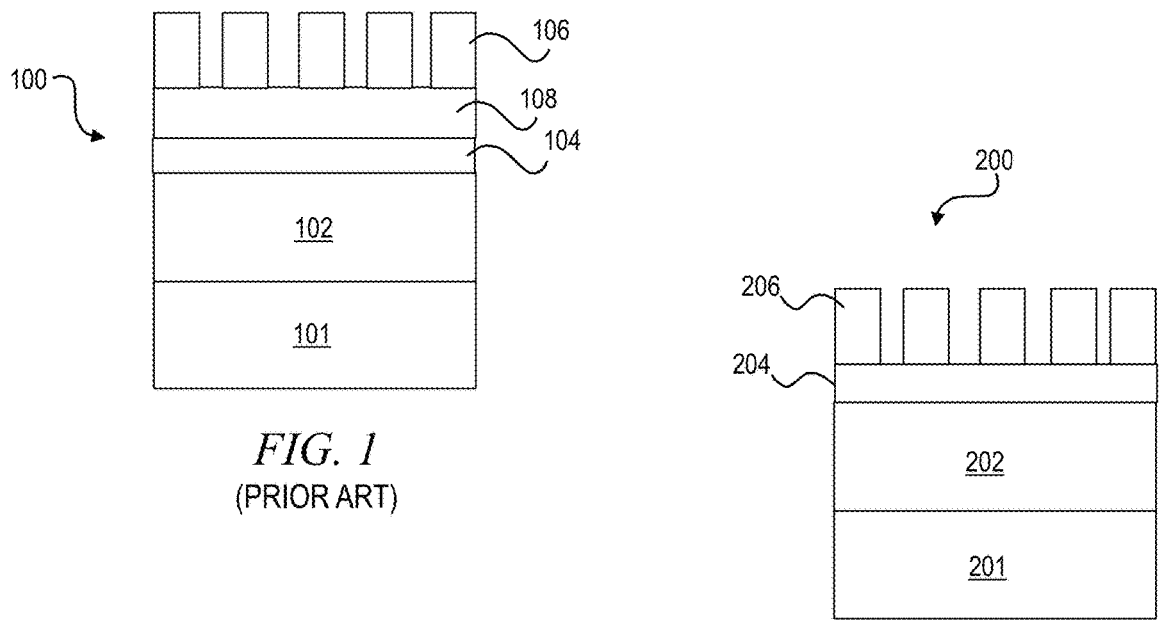
FIG. 1 depicts in a schematic a semiconductor fabrication stack including four layers according to the prior art.
FIG. 2 depicts in a schematic a semiconductor fabrication stack including three layers according to an exemplary embodiment.
FIG. 3 depicts in a flowchart steps of a method for fabricating a semiconductor device using a three layer stack according to an exemplary embodiment.

Consider FIG. 1, which depicts in a schematic the known state of the art. A common sequence of steps in semiconductor manufacturing, preparatory to photolithography, is deposition onto a semiconductor fabrication stack ("stack" 100) of four layers including a planarization layer 102 (on one or more conventional underlying layers 101), a hardmask 104, and a photoresist 106. When the hardmask 104 is a metal oxide and the photoresist 106 is organic, an intermediate organic layer 108 is required to be deposited between the hardmask and the photoresist in order to provide adequate adhesion by increasing hydrophobicity as measurable by the contact angle of water on the intermediate organic layer. For example, hexamethyldisilizane (HMDS) is used to "prime" the metal oxide hardmask 104. Without priming by the intermediate organic layer 108, the photoresist 106 tends to peel away from the metal oxide hardmask 104 during subsequent processing. This potentially results in lithographic defects, such as adhesion failure and pattern collapse, which detract from device performance or even render the device unusable. However, HMDS itself may cause resist component segregation and hence cause resist footing.

Thus, certain state of the art processes require four chemical steps preparatory to each photolithographic process on the stack 100: depositing the planarization layer 102, then the hardmask 104, then the intermediate organic layer 108, and then the photoresist 106. Each step requires different process chemicals and protocols.

In contrast, FIG. 2 depicts, in a schematic, a semiconductor fabrication stack 200 according to an exemplary embodiment. The stack 200 includes a planarization layer 202 that is deposited onto underlying layers 201 of the stack; in one or more embodiments, the planarization layer 202 may be an organic planarization layer. On top of the planarization layer 202 is a metal oxide hardmask 204 that is doped with both carbon and nitrogen. An organic photoresist 206 is deposited directly onto the doped metal oxide hardmask (i.e., in one or more embodiments, there is no intermediate organic layer (and in one or more embodiments no intermediate layer of any type, organic and/or inorganic) between the hardmask and the photoresist). Because of the doping in the metal oxide hardmask 204, which increases the hydrophobicity (water contact angle) of the hardmask, the photoresist 206 exhibits adequate adhesion during subsequent processing. Therefore, deposition of an intermediate organic layer is not required. Accordingly, over the course of up to fifty photolithographic processes, significant savings can be achieved in time, process chemicals, and potential process defects.

One or more embodiments are particularly applicable to patterning sub-50 nm structures.

Figure 4:
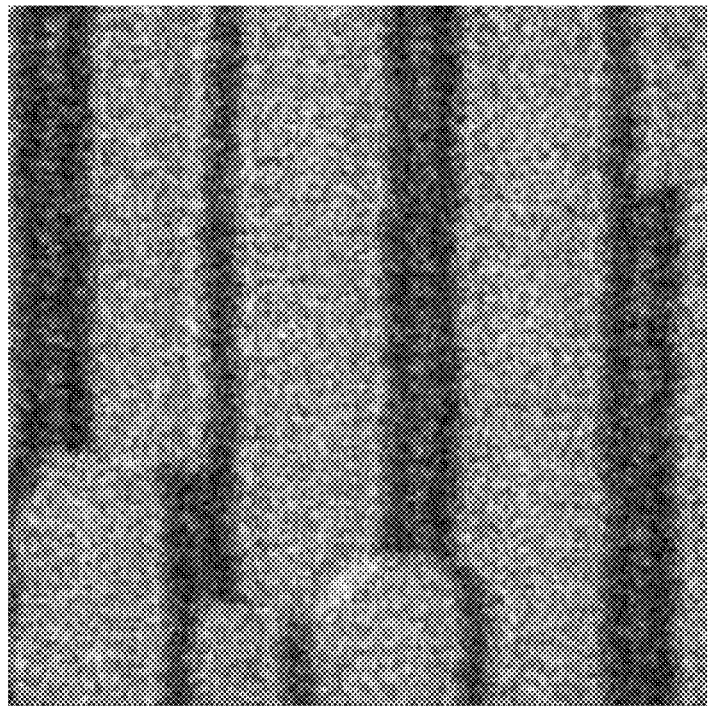
FIG. 4 depicts a scanning electron microscope (SEM) image of photoresist applied according to the prior art.
Figure 5:
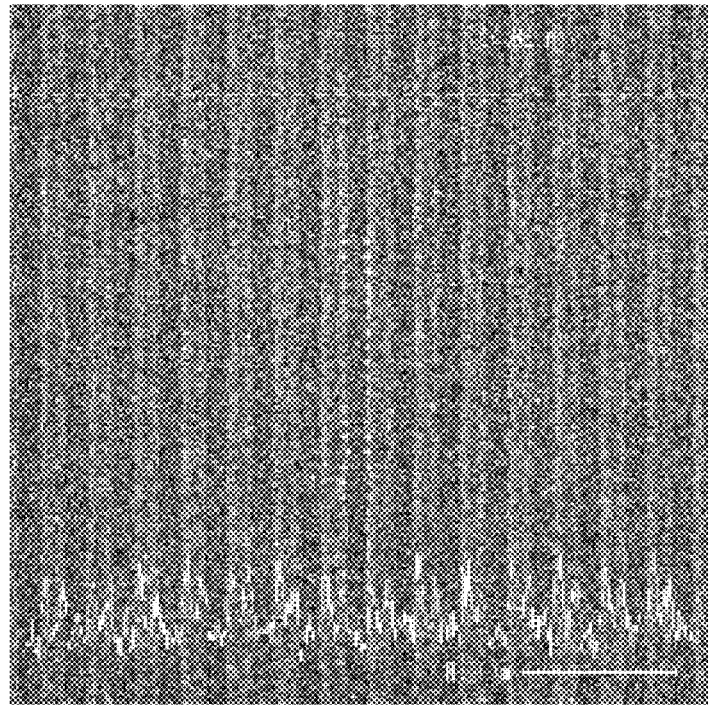
FIG. 5 depicts an SEM image of photoresist applied according to aspects of the invention.

Consider FIG. 4, which depicts a scanning electron microscope (SEM) image of photoresist applied to an HMDS-treated hardmask according to FIG. 1. Note the photoresist in FIG. 4 is striped with lift-off features where it has not properly adhered. Compare FIG. 5, which depicts an SEM image of photoresist applied to a hardmask implanted with carbon and nitrogen ions according to aspects of the invention. Note the photoresist in FIG. 5 is uniform in appearance, without lift-off, indicating proper adhesion across the entire area.

In one or more embodiments, the doped metal oxide hardmask exhibits a water contact angle sufficient to enable adhesion of the photoresist without a priming layer. As a non-limiting example, the water contact angle of the doped metal oxide hardmask is greater than 80°.

In one or more embodiments, the metal oxide hardmask is doped to have at least 5% by weight combined carbon and nitrogen ions. In one or more embodiments, the metal oxide hardmask is doped to have no more than 30% by weight combined carbon and nitrogen ions. In one or more embodiments, the metal oxide hardmask preferably is doped to have no more than 20% by weight combined carbon and nitrogen ions. In one or more embodiments, the metal oxide hardmask is doped to have a range of from 5% by weight to 20% by weight combined carbon and nitrogen ions. In one or more embodiments, the metal hardmask includes at least one high-Z metal such as tin (Sn), titanium (Ti), tantalum (Ta), ruthenium (Ru), or tungsten (W). These metals have relatively high absorbance in the extreme ultraviolet (EUV) range (due to their large number of protons in the nucleus) and they can be removed by plasma wet etch processes; therefore, they are suitable as hardmasks for pattern transfer. They also exhibit improved organic photoresist adhesion when doped as described herein.

In one or more embodiments, the metal oxide hardmask is doped to have a combination of carbon and nitrogen where carbon to nitrogen is in the ratio of at least 4:1. In one or more embodiments, the metal oxide hardmask is doped to have a combination of carbon and nitrogen where carbon to nitrogen is in the ratio of no more than 16:1. In one or more embodiments, the metal oxide hardmask is doped to have a range of combination of carbon and nitrogen where carbon to nitrogen is in the ratio of from 4:1 to 16:1.

In one or more embodiments, the metal oxide hardmask is doped to have a surface concentration of at least $1E8/cm^2$ carbon ions (notation $1E8=1\times10^8$). In one or more embodiments, the metal oxide hardmask is doped to have a surface concentration of at least $1E8/cm^2$ nitrogen ions. In one or more embodiments, the metal oxide hardmask is doped to have a surface concentration of at least $2E8/cm^2$ combined carbon and nitrogen ions. In one or more embodiments, the metal oxide hardmask is doped to have a surface concentration of no more than $1E12/cm^2$ combined carbon and nitrogen ions.

Referring also still to FIG. 2, FIG. 3 depicts. in a flowchart. steps of a method 300 for fabricating a semiconductor device using a three layer stack such as the stack 200, according to an exemplary embodiment. At 302, deposit the planarization layer 202 onto the underlying layers 201. At 304, deposit the metal oxide hardmask 204 onto the planarization layer 202. At 306, dope the metal oxide hardmask 204 with both carbon and nitrogen. At decision block 307, rendered as a rectangle rather than a diamond for illustrative convenience, check whether a composition of the doped metal oxide hardmask meets a specification by performing X-ray photoelectron spectroscopy, as described with respect to FIGS. 6-10. At 308, repeat the doping of the metal oxide hardmask in response to the composition of the doped metal oxide hardmask not meeting the specification. At 310, once the specification is met, deposit the organic photoresist 206 directly onto the doped metal oxide hardmask 204 (i.e., in one or more embodiments, deposition of an intermediate layer between the hardmask and the photoresist is not required and is not carried out).

In one or more embodiments, the metal oxide hardmask is doped by low energy implantation of carbon and nitrogen ions. For example, in one or more embodiments carbon ions are implanted at an energy of about 0.5 eV to about 2 keV. In one or more embodiments, nitrogen ions are implanted at an energy of about 15 eV to about 25 keV.

In one or more embodiments, the metal oxide hardmask is doped by sequential plasma treatment with carbon and then with nitrogen.

In one or more embodiments, doping the metal oxide hardmask comprises applying a doping treatment until doping is achieved to a depth not less than 2 nm. In one or more embodiments, the hardmask is doped to not less than 5 nm.

Figure 6:
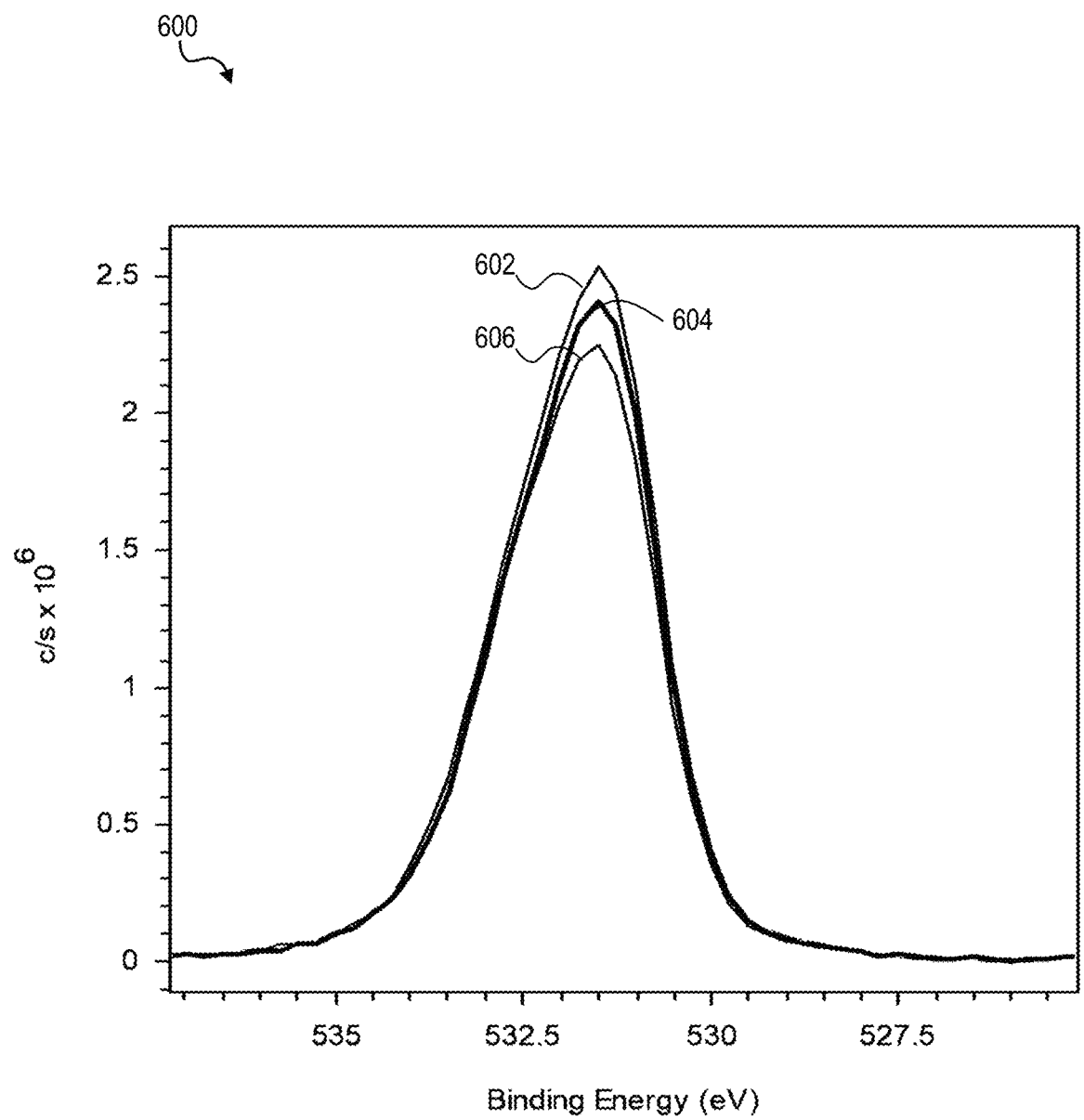
FIG. 6 through FIG. 10 depict X-ray spectroscopy binding energy results following development of an organic photoresist applied according to an exemplary embodiment.
Figure 7:
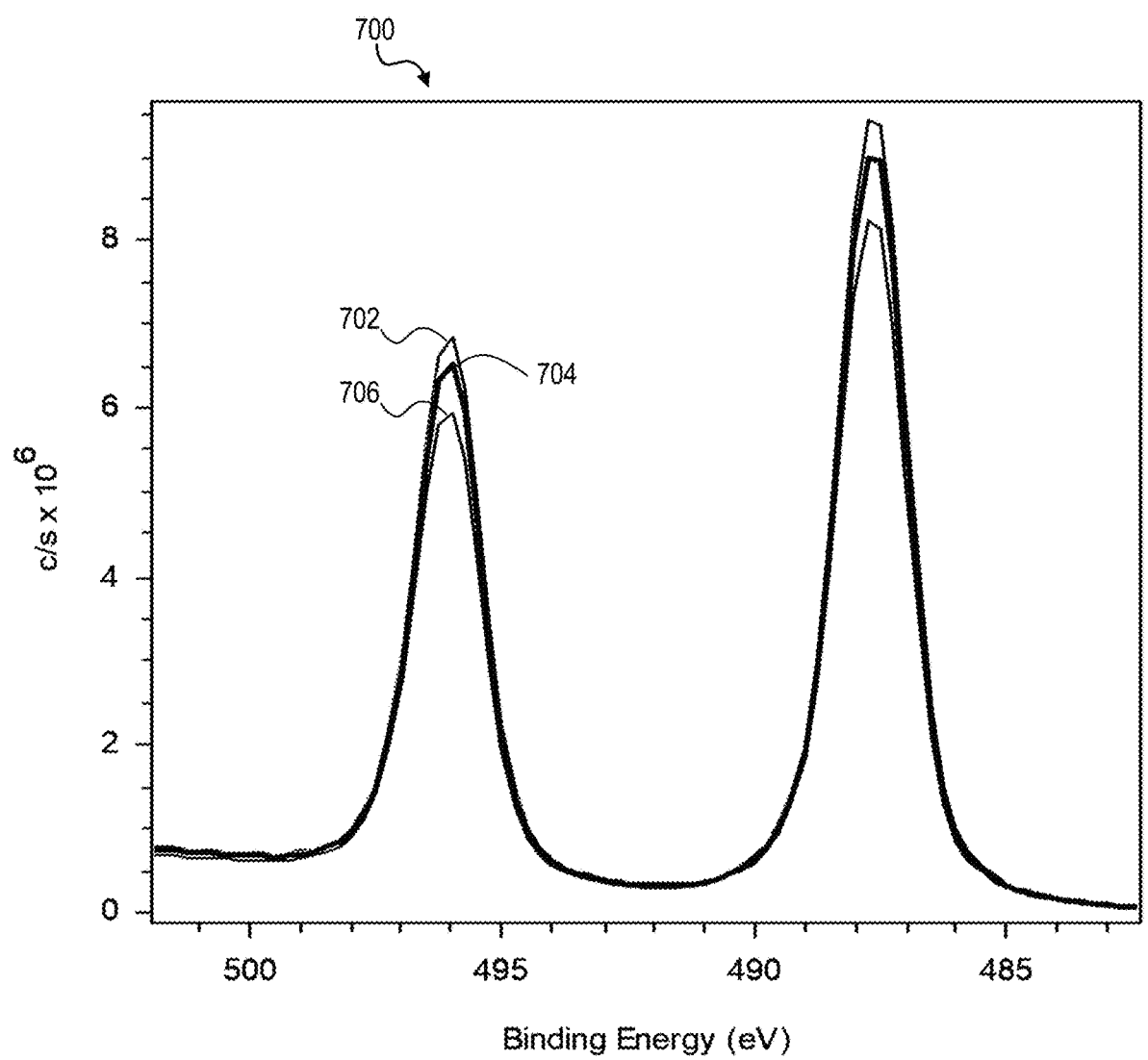
Figure 8:
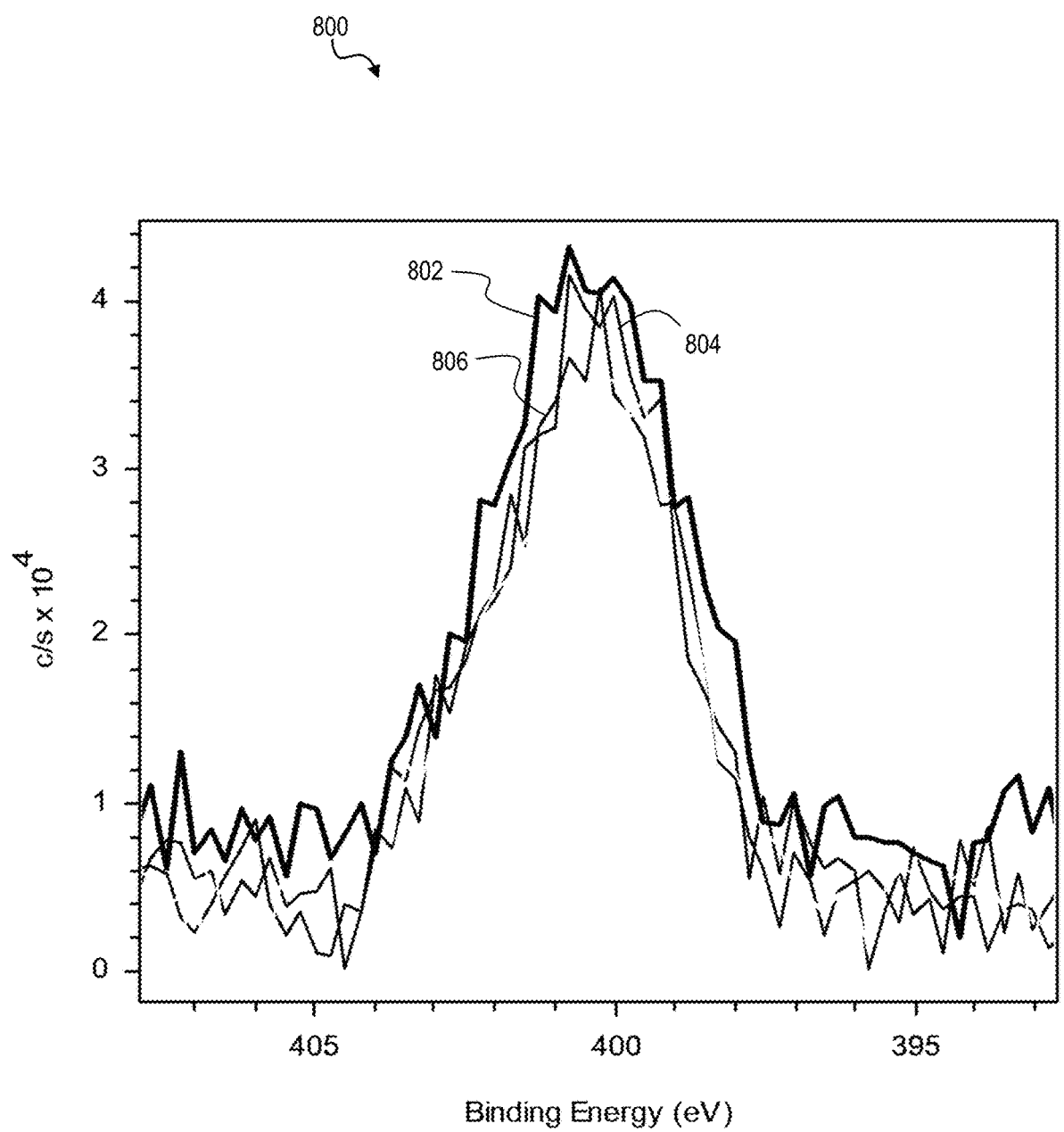
Figure 9:
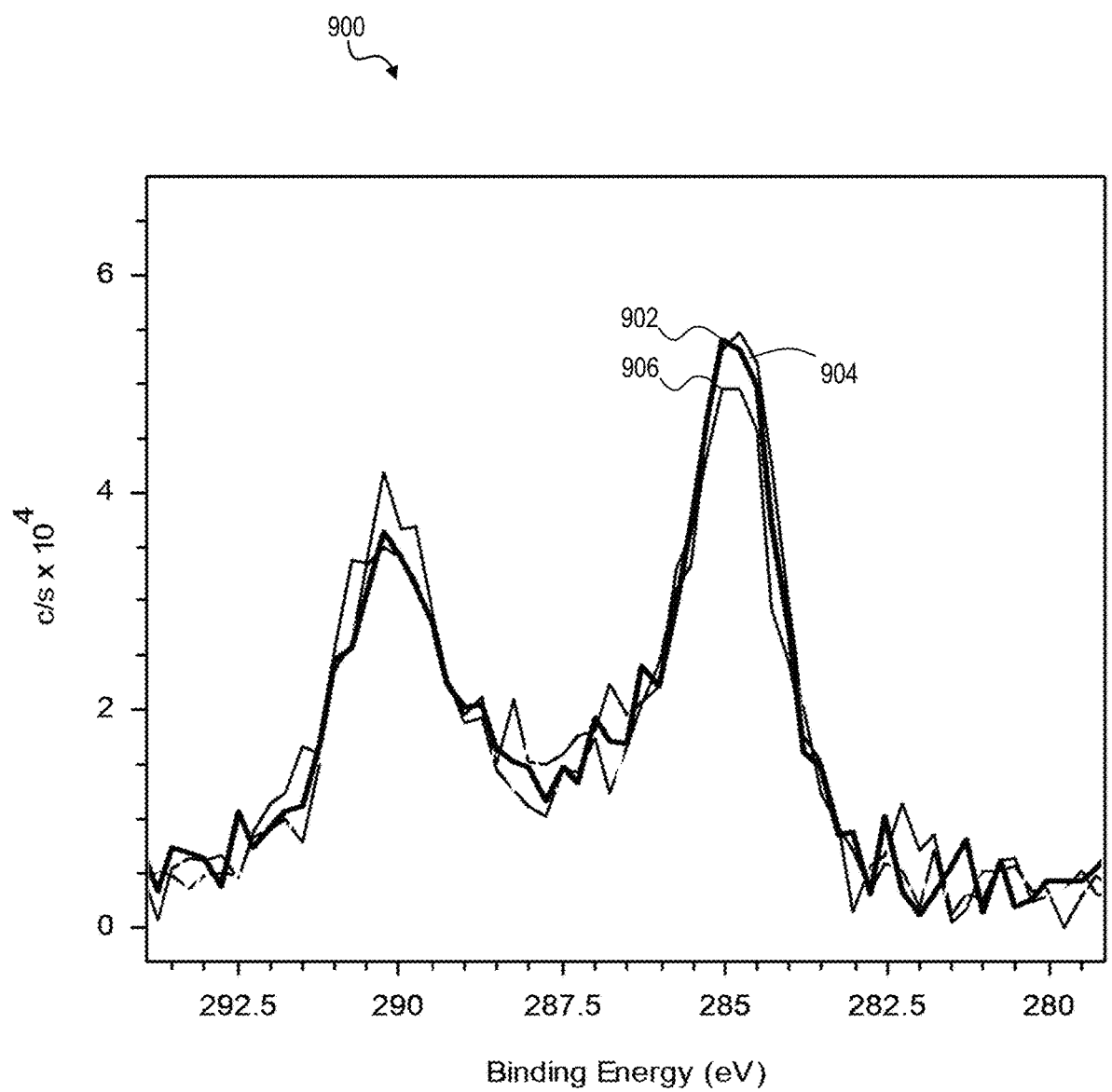
Figure 10:
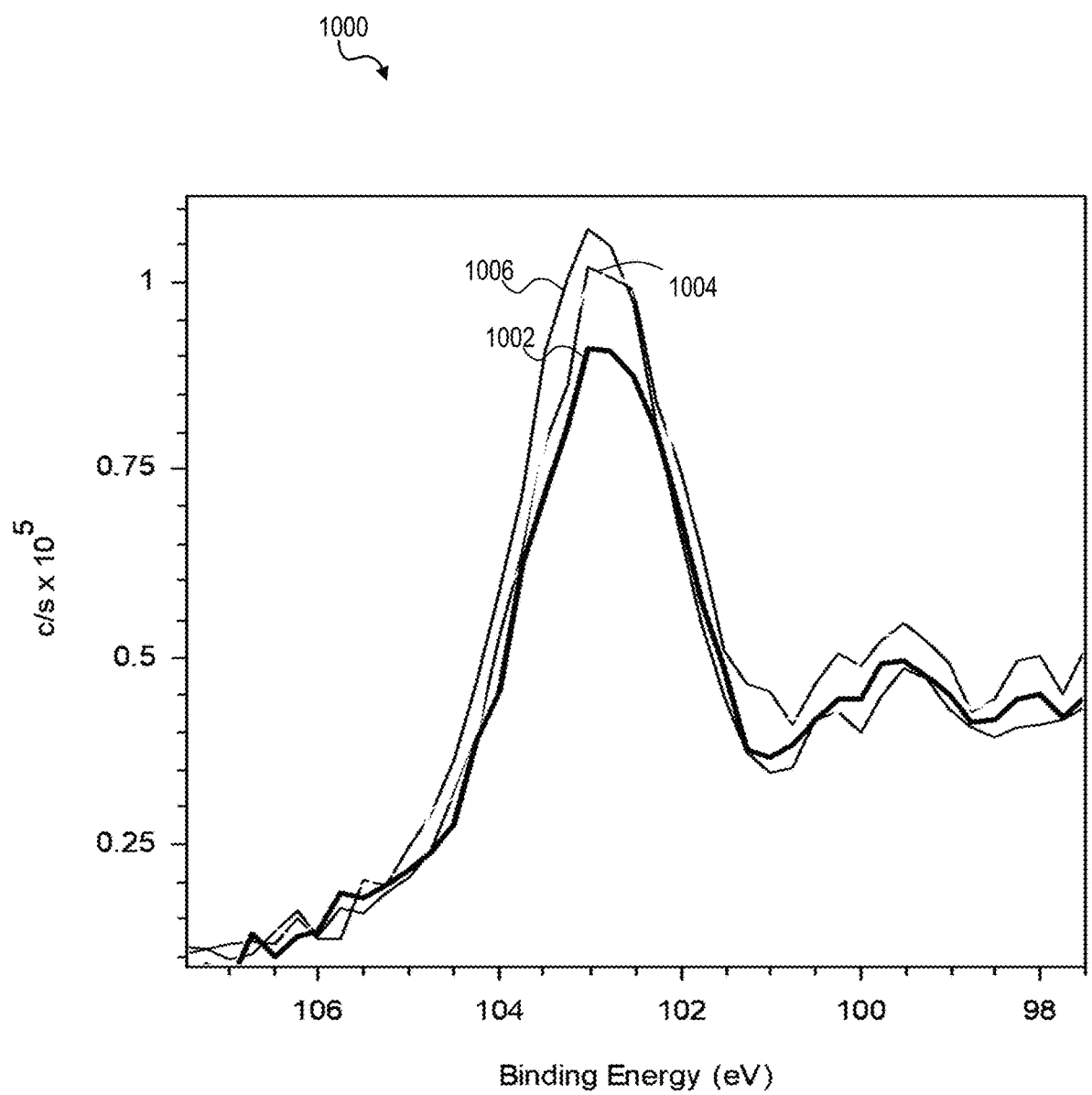

When trying different implant techniques for the hardmask, one goal was to obtain a surface characteristic as depicted in FIG. 5. In order to obtain such a characteristic, it was found to be helpful to have particular concentrations and ratios of atoms at the surface of the hardmask. FIG. 6 through FIG. 10 depict experimental X-ray photoelectron spectroscopy (XPS) results for the atomic constituents at the surface of the hardmask prior to applying the photoresist and obtaining good adhesion. In these figures, the x-axis corresponds to electron binding energy while the y-axis corresponds to counts-per-second. The peaks correspond to concentrations of the various atomic constituents. FIG. 6 depicts XPS results 600 for the is electron of oxygen (O) at the surface of a metal oxide hardmask following carbon-nitrogen doping of the hardmask for three different wafers 602, 604, and 606. FIG. 7 depicts XPS results 700 for the $3d$ electron of tin (Sn) at the surface of a metal oxide hardmask following carbon-nitrogen doping of the hardmask for three different wafers 702, 704, and 706. FIG. 8 depicts XPS results 800 for the is electron of nitrogen (N) at the surface of a metal oxide hardmask following carbon-nitrogen doping of the hardmask for three different wafers 802, 804, and 806. FIG. 9 depicts XPS results 900 for the is electron of carbon (C) at the surface of a metal oxide hardmask following carbon-nitrogen doping of the hardmask for three different wafers 902, 904, and 906. FIG. 10 depicts XPS results 1000 for the $2p$ electron of silicon (Si) at the surface of a metal oxide hardmask following carbon-nitrogen doping of the hardmask for three different wafers 1002, 1004, and 1006. The ordinary skilled worker will appreciate that the XPS intensities for the characteristic binding energies of all five elements are relatively high, and aspects of the invention include the ratios of the elements at the surface that are suitable for improving adhesion of the photoresist. Using a tool such as the Revera VeraFlex, now available from Nova Measuring Instruments Ltd., Rehovot Israel, suitable ratios of elements (as discussed above) were determined from the peaks of the binding energy curves.

We have found that that very high amounts of carbon implantation, alone, do not appear to improve photoresist adhesion to a hardmask; however, implantation of nitrogen in addition to carbon does significantly improve adhesion.

Given the foregoing description, and in light of the accompanying drawings, it will be apparent to the ordinary skilled worker that according to one aspect of the invention, an exemplary method 300 includes, at 302, depositing a planarization layer 202 onto a semiconductor fabrication stack 201; at 304, depositing a metal oxide hardmask 204 onto the planarization layer 202; at 306, doping the metal oxide hardmask with both carbon and nitrogen; and at 310, depositing an organic photoresist 206 directly onto the doped metal oxide hardmask. It will further be apparent that in one or more embodiments, due to the doping with carbon and nitrogen, the doped metal oxide hardmask exhibits a water contact angle of greater than 80°. In one or more embodiments, the method 300 also includes, as at step 312, developing and exposing the photoresist 206 (without collapse or footing).

In one or more embodiments, the metal oxide hardmask is doped by low energy implantation of carbon and nitrogen ions. In one or more embodiments, the metal oxide hardmask is doped by sequential plasma treatment with carbon and then with nitrogen. In one or more embodiments, doping the metal oxide hardmask comprises applying a treatment for sufficient time to achieve doping to a depth not less than 2 nm.

In one or more embodiments, the metal oxide hardmask is doped to have at least 5% by weight combined carbon and nitrogen ions. In one or more embodiments, the metal oxide hardmask is doped to have no more than 30% by weight combined carbon and nitrogen ions. In one or more embodiments, the metal oxide hardmask is doped to have a combination of carbon and nitrogen where carbon to nitrogen is in the ratio of at least 4:1. In one or more embodiments, the metal oxide hardmask is doped to have a combination of carbon and nitrogen where carbon to nitrogen is in the ratio of no more than 16:1.

In one or more embodiments, the metal oxide hardmask is doped to have a surface concentration of at least $1E8/cm^2$ carbon ions. In one or more embodiments, the metal oxide hardmask is doped to have a surface concentration of at least $1E8/cm^2$ nitrogen ions. In one or more embodiments, the metal oxide hardmask is doped to have a surface concentration of at least $2E8/cm^2$ combined carbon and nitrogen ions. In one or more embodiments, the metal oxide hardmask is doped to have a surface concentration of no more than $1E12/cm^2$ combined carbon and nitrogen ions.

According to another aspect of the invention, an exemplary semiconductor fabrication stack 200 includes underlying layers 201; an organic planarization layer 202 atop the underlying layers 201; a metal oxide hardmask 204 top the organic planarization layer 202 and including both carbon and nitrogen; and an organic photoresist 206 directly atop the metal oxide hardmask. The metal oxide hardmask exhibits a water contact angle of greater than 80°.

In one or more embodiments, the metal oxide hardmask includes at least 5% by weight combined carbon and nitrogen ions. In one or more embodiments, the metal oxide hardmask includes no more than 20% by weight combined carbon and nitrogen ions. In one or more embodiments, the metal oxide hardmask includes a combination of carbon and nitrogen where carbon to nitrogen is in the ratio of at least 4:1. In one or more embodiments, the metal oxide hardmask includes a combination of carbon and nitrogen where carbon to nitrogen is in the ratio of no more than 16:1.

In one or more embodiments, the metal oxide hardmask includes a surface concentration of at least $1E8/cm^2$ carbon ions. In one or more embodiments, the metal oxide hardmask includes a surface concentration of at least $1E8/cm^2$ nitrogen ions. In one or more embodiments, the metal oxide hardmask includes a surface concentration of at least $2E8/cm^2$ combined carbon and nitrogen ions.

According to another aspect, an exemplary method includes at 302 depositing a planarization layer onto a semiconductor fabrication stack; at 304 depositing a metal oxide hardmask onto the planarization layer; at 306 doping the metal oxide hardmask with both carbon and nitrogen; at decision block 307 checking whether a composition of the doped metal oxide hardmask meets a specification by performing X-ray photoelectron spectroscopy; and at 308 repeating the doping process in response to the composition of the metal oxide hardmask not meeting the specification. For example, repeat until the specification is met.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The drawing figures as discussed above depict exemplary processing steps/stages in the fabrication of exemplary structures. Although the overall fabrication methods and the structures formed by such methods are entirely novel, certain individual processing steps required to implement the method may utilize conventional semiconductor fabrication techniques and conventional semiconductor fabrication tooling. These techniques and tooling already will be familiar to one having ordinary skill in the relevant arts given the teachings herein. Moreover, one or more of the processing steps and tooling used to fabricate semiconductor devices also are described in a number of readily available publications, including, for example James D. Plummer et al., *Silicon VLSI Technology: Fundamentals, Practice, and Modeling* 1$^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "overlaying" or "underlying" describe relative positions and do not imply that the structures so indicated necessarily are "above" or "below" the other structures in a finished assembly. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device. Thus, when a first structure is described as "on," "overlying," "on top," "positioned on" a second structure (or words of similar import), this means that other structures may be present between the first structure and the second structure. However, when the term "directly" is used together with "on," "overlying," "on top," "positioned on," or in the phrase "direct contact" (or words of similar import), this means that the first and second structures are connected to each other without any intermediate structures between them.

What is claimed is:

1. A method comprising:
   depositing a planarization layer onto a semiconductor fabrication stack;
   depositing a metal oxide hardmask onto the planarization layer;
   doping the metal oxide hardmask with both carbon and nitrogen; and
   depositing an organic photoresist directly onto the doped metal oxide hardmask,
   wherein the doped metal oxide hardmask exhibits a water contact angle of greater than 80°.

2. The method of claim 1, wherein the metal oxide hardmask is doped by low energy implantation of carbon and nitrogen ions.

3. The method of claim 1, wherein the metal oxide hardmask is doped by sequential plasma treatment with carbon and then with nitrogen.

4. The method of claim 1, wherein doping the metal oxide hardmask comprises applying a treatment for sufficient time to achieve doping to a depth not less than 2 nm.

5. The method of claim 1, wherein the metal oxide hardmask is doped to have at least 5% by weight combined carbon and nitrogen ions.

6. The method of claim 5, wherein the metal oxide hardmask is doped to have no more than 30% by weight combined carbon and nitrogen ions.

7. The method of claim 5, wherein the metal oxide hardmask is doped to have a combination of carbon and nitrogen where carbon to nitrogen is in the ratio of at least 4:1.

8. The method of claim 7, wherein the metal oxide hardmask is doped to have a combination of carbon and nitrogen where carbon to nitrogen is in the ratio of no more than 16:1.

9. The method of claim 1, wherein the metal oxide hardmask is doped to have a surface concentration of at least $1E8/cm^2$ carbon ions.

10. The method of claim 1, wherein the metal oxide hardmask is doped to have a surface concentration of at least $1E8/cm^2$ nitrogen ions.

11. The method of claim 1, wherein the metal oxide hardmask is doped to have a surface concentration of at least $2E8/cm^2$ combined carbon and nitrogen ions.

12. The method of claim 11, wherein the metal oxide hardmask is doped to have a surface concentration of no more than $1E12/cm^2$ combined carbon and nitrogen ions.

13. A semiconductor fabrication stack comprising:
    underlying layers;
    an organic planarization layer atop the underlying layers;
    a metal oxide hardmask atop the organic planarization layer and including both carbon and nitrogen; and
    an organic photoresist directly atop the metal oxide hardmask,
    wherein the metal oxide hardmask exhibits a water contact angle of greater than 80°.

14. The stack of claim 13, wherein the metal oxide hardmask includes at least 5% by weight combined carbon and nitrogen ions.

15. The stack of claim 14, wherein the metal oxide hardmask includes no more than 30% by weight combined carbon and nitrogen ions.

16. The stack of claim 14, wherein the metal oxide hardmask includes a combination of carbon and nitrogen where carbon to nitrogen is in the ratio of at least 4:1.

17. The stack of claim 16, wherein the metal oxide hardmask includes a combination of carbon and nitrogen where carbon to nitrogen is in the ratio of no more than 16:1.

18. The stack of claim 13, wherein the metal oxide hardmask has a surface concentration of at least $1E8/cm^2$ carbon ions.

19. The stack of claim 13, wherein the metal oxide hardmask has a surface concentration of at least $1E8/cm^2$ nitrogen ions.

20. A method comprising:
    depositing a planarization layer onto a semiconductor fabrication stack;
    depositing a metal oxide hardmask onto the planarization layer;
    doping the metal oxide hardmask with both carbon and nitrogen;
    checking whether a composition of the doped metal oxide hardmask meets a specification by performing X-ray photoelectron spectroscopy; and
    repeating the doping of the metal oxide hardmask in response to the composition of the metal oxide hardmask not meeting the specification.

* * * * *